US007920405B2

(12) United States Patent
Kang et al.

(10) Patent No.: US 7,920,405 B2
(45) Date of Patent: Apr. 5, 2011

(54) CIRCUITS AND METHODS FOR ADAPTIVE WRITE BIAS DRIVING OF RESISTIVE NON-VOLATILE MEMORY DEVICES

(75) Inventors: Sang-beom Kang, Hwaseong-si (KR); Woo-yeong Cho, Suwon-si (KR); Hyung-rok Oh, Yongin-si (KR); Joon-min Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 129 days.

(21) Appl. No.: 11/957,756

(22) Filed: Dec. 17, 2007

(65) Prior Publication Data
US 2008/0151601 A1 Jun. 26, 2008

(30) Foreign Application Priority Data

Dec. 20, 2006 (KR) ........................ 10-2006-0131245

(51) Int. Cl.
*G11C 11/00* (2006.01)
*G11C 11/36* (2006.01)
(52) U.S. Cl. ......... 365/148; 365/158; 365/163; 365/175
(58) Field of Classification Search .................. 365/148, 365/158, 163, 171, 173, 175
See application file for complete search history.

(56) References Cited

U.S. PATENT DOCUMENTS

| | | | | |
|---|---|---|---|---|
| 6,862,213 B2* | 3/2005 | Hamaguchi | .................... | 365/148 |
| 6,928,022 B2 | 8/2005 | Cho et al. | | |
| 6,940,744 B2* | 9/2005 | Rinerson et al. | .............. | 365/148 |
| 6,985,376 B2* | 1/2006 | Matsuoka | ...................... | 365/148 |
| 7,020,014 B2* | 3/2006 | Khouri et al. | ................. | 365/148 |
| 7,190,607 B2 | 3/2007 | Cho et al. | | |
| 7,209,379 B2* | 4/2007 | Mori et al. | ..................... | 365/148 |
| 7,236,388 B2 | 6/2007 | Hosoi et al. | | |
| 7,236,393 B2 | 6/2007 | Cho et al. | | |
| 7,292,469 B2* | 11/2007 | Lee et al. | ....................... | 365/148 |
| 7,480,167 B2* | 1/2009 | Ahn | ............................. | 365/148 |

(Continued)

FOREIGN PATENT DOCUMENTS
KR    10-2005-0118331 A    12/2005

(Continued)

OTHER PUBLICATIONS

Notice of Allowance, KR Application No. 10-2006-0131245, Jan. 22, 2008.

*Primary Examiner* — Trong Phan
(74) *Attorney, Agent, or Firm* — Myers Bigel Sibley & Sajovec

(57) ABSTRACT

A non-volatile memory device includes a memory cell array including a memory cell array having word lines, bit lines, and non-volatile memory cells, each non-volatile memory cell having a variable resistive material and an access element connected between the corresponding word line and the corresponding bit line. The variable resistive material has a resistance level that varies according to data to be stored. A selection circuit selects at least one non-volatile memory cell in which data will be written. An adaptive write circuit/method supplies a write bias to the selected non-volatile memory cell through the bit line connected to the selected non-volatile memory cell to write data in the selected non-volatile memory cell and varies (e.g., increases) the write bias until the resistance level of the selected non-volatile memory cell varies.

28 Claims, 13 Drawing Sheets

U.S. PATENT DOCUMENTS

| | | | |
|---|---|---|---|
| 7,486,536 B2 * | 2/2009 | Kim et al. | 365/148 |
| 7,515,461 B2 * | 4/2009 | Happ et al. | 365/148 |
| 7,535,756 B2 * | 5/2009 | Lung | 365/148 |
| 7,573,758 B2 * | 8/2009 | Park et al. | 365/148 |
| 7,580,278 B2 * | 8/2009 | Cho et al. | 365/148 |
| 7,586,776 B2 * | 9/2009 | Oh et al. | 365/148 |
| 2004/0027849 A1 | 2/2004 | Yang et al. | |
| 2005/0058009 A1 | 3/2005 | Yang et al. | |
| 2005/0068804 A1 | 3/2005 | Choi et al. | |

FOREIGN PATENT DOCUMENTS

| | | |
|---|---|---|
| KR | 10-0564577 B1 | 3/2006 |
| KR | 10-0618836 B1 | 8/2006 |

\* cited by examiner

CIRCUITS AND METHODS FOR ADAPTIVE WRITE BIAS DRIVING OF RESISTIVE NON-VOLATILE MEMORY DEVICES

CROSS-REFERENCE TO RELATED APPLICATION

This application claims the benefit under 35 USC §119 of Korean Patent Application No. 10-2006-0131245, filed on Dec. 20, 2006, the disclosure of which is hereby incorporated herein by reference in its entirety as if set forth fully herein.

FIELD OF THE INVENTION

The present invention relates to non-volatile memory devices and methods of driving the same.

BACKGROUND OF THE INVENTION

Non-volatile memory devices are widely used in many consumer, commercial and other applications. Non-volatile memory devices using a resistive material include, for example, a resistive random access memory (RRAM), a phase change RAM (PRAM), and a magnetic RAM (MRAM). While a dynamic RAM or a flash memory uses charge to store data, the non-volatile memory device using the resistive material stores data using a variation in the resistance of a variable resistive material (RRAM), a variation in the state of a phase change material (PRAM), such as a chalcogenide alloy, or a variation in the resistance of a magnetic tunnel junction (MTJ) thin film according to the magnetization state of a ferromagnetic substance (MRAM).

A resistive memory cell generally includes a first electrode, a second electrode, and a variable resistive material interposed therebetween, and the resistance level of the variable resistive material varies according to a voltage applied between the first and second electrodes. In particular, in some embodiments, a filament serving as a current path of a cell current may be formed in the variable resistive material. A state in which a portion of the filament is cut may be defined as a reset state, a high-resistance state, and/or reset data (1 data), and a state in which filament is connected may be defined as a set state, a low-resistance state, and/or set data (0 data). Other techniques of providing high and low resistance states also may be used.

A reset voltage having a sufficient voltage level to cut the filament or otherwise provide a high resistance state may be supplied to write reset data in the resistive memory cell, and a set voltage having a sufficient voltage level to connect the filament or otherwise provide a low resistance state may be supplied to write set data in the resistive memory cell. In addition, a voltage having a sufficiently low voltage level not to change the state of the filament or resistance may be supplied to read out the stored reset data or set data.

SUMMARY OF THE INVENTION

Some embodiments of the invention provide non-volatile memory devices with adaptive write circuits. These non-volatile memory devices may include a memory cell array comprising a plurality of word lines, a plurality of bit lines, and a plurality of non-volatile memory cells, a respective non-volatile memory cell having a variable resistive material and an access element connected between the corresponding word line and the corresponding bit line, the variable resistive material having a resistance level varying according to data to be stored. A selection circuit is configured to select at least one non-volatile memory cell of the plurality of non-volatile memory cells in which data will be written. The adaptive write circuit is configured to supply a write bias to the selected non-volatile memory cell through the bit line connected to the selected non-volatile memory cell to write data in the selected non-volatile memory cell and is further configured to vary (e.g., increase) the write bias, for example from a predetermined voltage level, until the resistance level of the selected non-volatile memory cell varies.

According to other embodiments of the invention, non-volatile memory devices include a memory cell array including a plurality of non-volatile memory cells having a variable resistive material whose resistance level varies according to data to be stored. A selection circuit is configured to select at least one non-volatile memory cell of the plurality of non-volatile memory cells in which data will be written. An adaptive write circuit is configured to supply a gradually varying (e.g., increasing) write bias to the selected non-volatile memory cell while monitoring the resistance level of the selected non-volatile memory cell and to terminate the gradual variation (e.g., increase) of the write bias when the resistance level of the selected non-volatile memory cell varies by a given amount.

According to still other embodiments of the invention, non-volatile memory devices include a non-volatile memory cell having a variable resistive material whose resistance level varies according to data to be stored. A sensing node has a voltage level that varies according to a cell current flowing through the non-volatile memory cell. A sensing circuit is configured to compare the voltage level of the sensing node with a reference voltage level and to output a result of the comparison. A write bias supply circuit is configured to supply a write bias to the non-volatile memory cell through the sensing node and to vary (e.g., increase) the bias level of the write bias according to the result output from the sensing circuit.

Other embodiments of the invention provide methods of driving non-volatile memory devices that include a plurality of non-volatile memory cells having a variable resistive material whose resistance level varies according to data to be stored. These driving methods comprise supplying a write bias that gradually varies (e.g., increases) to a selected non-volatile memory cell while monitoring the resistance level of the selected non-volatile memory cell until the resistance level of the selected non-volatile memory cell varies by a given amount, to thereby write data in the selected non-volatile memory cell.

Details of other embodiments of the invention are included in the detailed description of the invention and the drawings.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
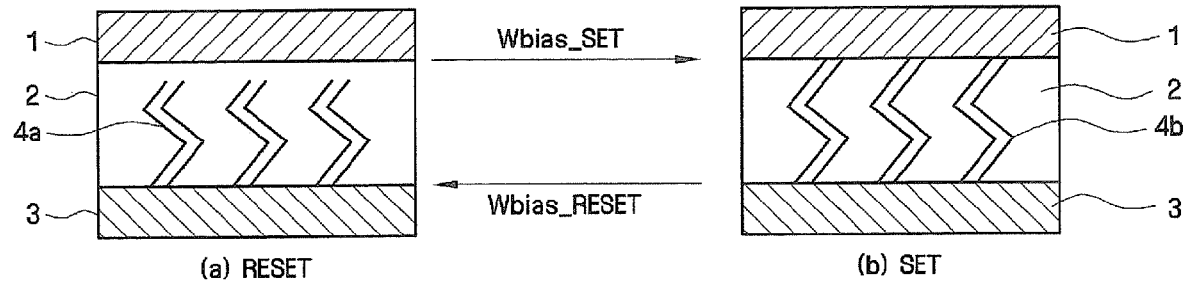
FIGS. 1 and 2 are diagrams illustrating operational characteristics of a non-volatile memory cell that can be used in non-volatile memory devices according to various embodiments of the invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes," "including," "have," "having" and variants thereof, when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Hereinafter, various embodiments of the invention will be described below using a resistive RAM (RRAM). However, it will be understood by those skilled in the art that the invention can be applied to other non-volatile memory devices using resistive materials, such as a phase change random access memory (PRAM), a ferroelectric RAM (FRAM), and/or a magnetic RAM (MRAM).

Figure 2:
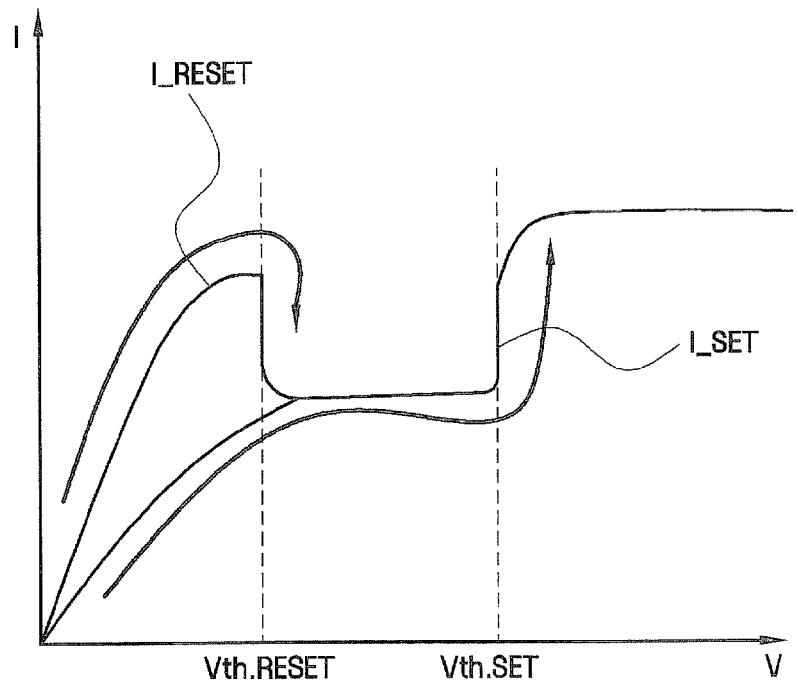

FIGS. 1 and 2 are diagrams illustrating operational characteristics of a non-volatile memory cell that can be used in non-volatile memory devices according to various embodiments of the invention.

First, referring to FIG. 1, the non-volatile memory cell includes a first electrode 1, a second electrode 3, and a variable resistive material 2 interposed therebetween. The resistance level of the variable resistive material 2 varies according to a bias applied between the first and second electrodes 1 and 3. Examples of the non-volatile memory cell are disclosed in U.S. Patent Application Publication Nos. US 2005/0058009, published Mar. 17, 2005, to Yang et al., entitled Memory Devices Based On Electric Field Programmable Films, and US 2004/0027849, published Feb. 12, 2004, to Yang et al, entitled Organic Bistable Device and Organic Memory Cells, the disclosures of which are hereby incorporated herein by reference in their entirety as if set forth fully herein. For example, NiO may be used as the variable resistive material 2, but embodiments of the invention are not limited thereto. In some embodiments, a filament 4 is formed in the variable resistive material 2, and the filament 4 serves as a current path of a cell current flowing between the upper electrode 1 and the lower electrode 3. Other mechanisms for current flow may also be used in other embodiments.

A reset bias Wbias_RESET is supplied to the first and second electrodes 1 and 3 to write reset data in the non-volatile memory cell. The reset data has high resistance since a filament 4a in the variable resistive material 2 is in an open state. On the other hand, a set bias Wbias_SET is supplied to the first and second electrodes 1 and 3 to write set data in the non-volatile memory cell. The set data has low resistance since a filament 4b in the variable resistive material 2 is in a short state. The reset bias Wbias_RESET may be supplied for a relatively long time of, for example, about several microseconds, but the set bias Wbias_SET may be supplied for a relatively short time of, for example, about several nanoseconds.

In FIG. 2, an X-axis indicates a voltage V applied between the first and second electrodes 1 and 3 and a Y-axis indicates a current I flowing through the variable resistive material 2. For the purpose of convenience of understanding, in FIG. 2, a value on the Y-axis is represented in log-scale. In FIG. 2, a graph I_SET shows the relationship between a voltage applied to the variable resistive material 2 in order to write set data in the variable resistive material 2 having reset data stored therein and a cell current flowing through the variable resistive material 2. A graph I_RESET shows the relationship between a voltage applied to the variable resistive material 2 in order to write reset data in the variable resistive material 2 having set data stored therein and a cell current flowing through the variable resistive material 2. As can be seen from the graph I_SET, the amount of cell current is suddenly increased at a voltage higher than a set threshold voltage Vth.SET, which shows that the resistance level of the variable resistive material 2 is changed from a high level to a low level. At that time, set data is written in the variable resistive material 2. In addition, as can be seen from the graph I_RESET, the amount of cell current is suddenly decreased at a voltage between a reset threshold voltage Vth.RESET and the set threshold voltage Vth.SET, which shows that the resistance level of the variable resistive material 2 is changed from a low level to a high level. At that time, reset data is written in the variable resistive material 2.

Figure 3:
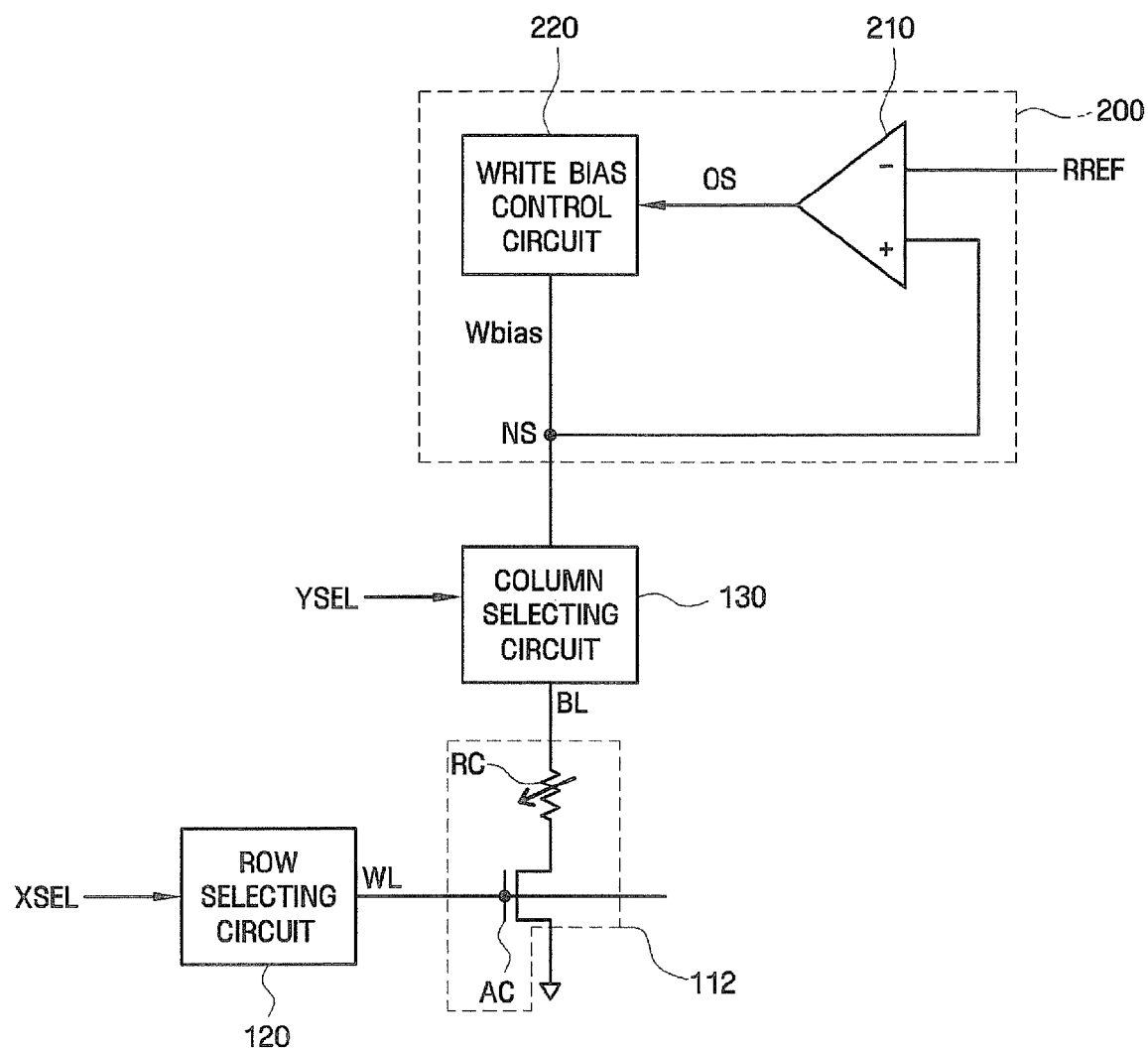
FIG. 3 is a block diagram illustrating a non-volatile memory device according to various embodiments of the invention.

FIG. 3 is a block diagram illustrating a non-volatile memory device according to various embodiments of the invention. FIGS. 4A to 4D are diagrams illustrating write voltages that can be used in non-volatile memory devices according to various embodiments of the invention.

First, referring to FIG. 3, non-volatile memory devices according to various embodiments of the invention include a memory cell array, selection circuits 120 and 130, and an adaptive write circuit 200.

The memory cell array includes a plurality of word lines WL, a plurality of bit lines BL, and a plurality of non-volatile memory cells 112. For convenience of explanation, only one non-volatile memory cell 112 selected from the plurality of non-volatile memory cells 112 is shown in FIG. 3. That is, a column selecting circuit 130 receives a column selecting signal YSEL to select the bit line BL, and a row selecting circuit 120 receives a row selecting signal XSEL to select the word line WL, so that the non-volatile memory cell 112 onto which data will be written is selected. The column selecting circuit 130 and/or the row selecting circuit 120 may be generically referred to as a "selection circuit".

The non-volatile memory cell 112 may include a variable resistive element RC and an access element AC which are connected between the word line WL and the bit line BL. Resistance level of the variable resistive element RC varies according to data to be stored and the access element AC controls a current flowing through the variable resistive element RC. In FIG. 3, a transistor which is connected in series to the variable resistive element RC is used as the access element AC, but the invention is not limited thereto. As shown in FIG. 1, the variable resistive element RC may include the variable resistive material 2 formed between the first electrode 1 and the second electrode 3.

The adaptive write circuit 200 supplies a write bias Wbias to the non-volatile memory cell 112 to write data in the selected non-volatile memory cell 112. That is, the adaptive write circuit 200 supplies the set bias Wbias_SET to write set data in the non-volatile memory cell 112 and supplies the reset bias Wbias_RESET to write reset data in the non-volatile memory cell 112. However, in some embodiments of the invention, the adaptive write circuit 200 provides a bias level capable of accurately writing reset data or set data to the plurality of non-volatile memory cells 112 in the memory cell array and supplies the reset bias Wbias_RESET or the set bias Wbias_SET. In addition, in FIG. 3, the write bias Wbias is supplied to the non-volatile memory cell 112 through the bit line BL, but the invention is not limited thereto. For example, it will be understood by those skilled in the art that various modifications and changes of the structure can be made.

Some embodiments of the invention may arise from recognition that a set bias Wbias_SET higher than the set threshold voltage Vth.SET should be supplied to the non-volatile memory cell 112 in order to write the set data on the non-volatile memory cell 112, and a reset bias Wbias_SET between the reset threshold voltage Vth.RESET and the set threshold voltage Vth.SET should be supplied to the non-volatile memory cell 112 in order to write the reset data on the non-volatile memory cell 112. However, the plurality of non-volatile memory cells 112 in the memory cell array may have different reset threshold voltages Vth.RESET and set threshold voltages Vth.SET. Therefore, the reset bias Wbias_RESET should have a bias level between the reset threshold voltage Vth.RESET and the set threshold value Vth.SET of each of the non-volatile memory cells 112, but it may be difficult to find the bias level. In addition, the set bias Wbias_SET should have a bias level higher than the set threshold voltage Vth.SET of each of the non-volatile memory cells 112. However, when the set bias Wbias_SET has an excessively high bias level, the filament may become fixed, which may make it difficult to rewrite the reset data. Therefore, the set bias Wbias_SET should not have a bias level considerably higher than the bias level of the set threshold voltage Vth.SET, but it may be very difficult to find a bias level satisfying these conditions.

Some embodiments of the invention can overcome these potentially conflicting requirements by providing an adaptive write circuit 200 for a non-volatile memory device according to various embodiments of the invention that supplies a write bias that gradually increases, for example from a predetermined bias level, to the selected non-volatile memory cell 112, while monitoring the resistance level of the selected non-volatile memory cell 112, for example in real time. In some embodiments, when the resistance level of the selected non-volatile memory cell 112 varies (from a high resistance level to a low resistance level or from a low resistance level to a high resistance level), the adaptive write circuit 200 may not further increase the write bias level.

In this way, it is possible to obtain the reset bias Wbias_RESET having a bias level between the reset threshold voltage Vth.RESET and the set threshold voltage Vth.SET of each of the plurality of non-volatile memory cells 112 in the memory cell array, and to obtain the set bias Wbias_SET having a bias level that can reduce or prevent the filament of each of the plurality of non-volatile memory cells 112 in the memory cell array from being fixed. That is, the above-mentioned structure makes it possible to accurately write data on the non-volatile memory cell 112 and can thus improve the reliability of the write operation.

Figure 4A:
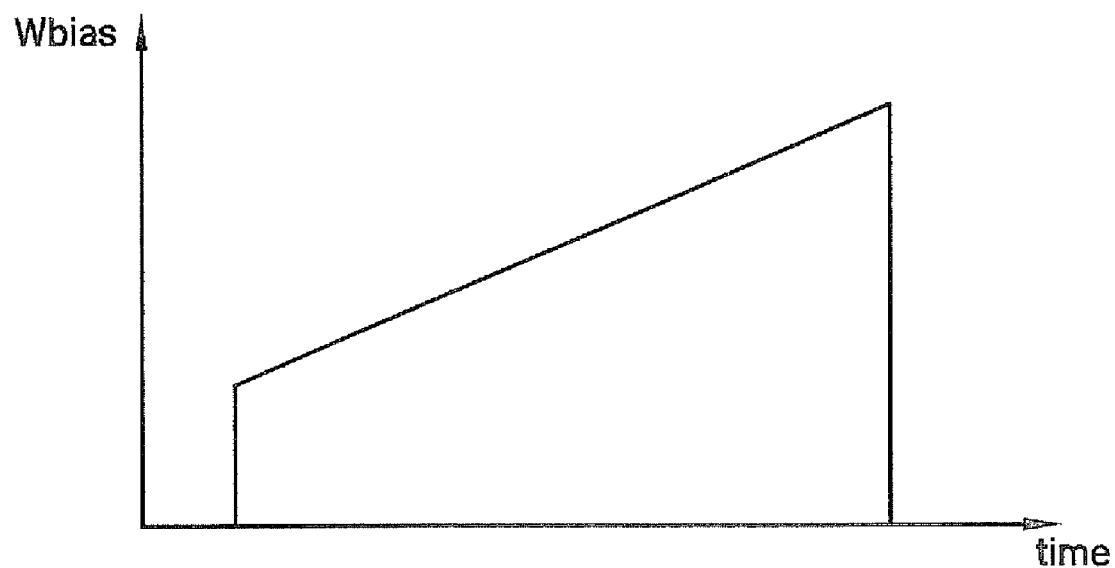
FIGS. 4A to 4D are diagrams illustrating write voltages that can be used for non-volatile memory devices according to various embodiments of the invention.
Figure 4B:
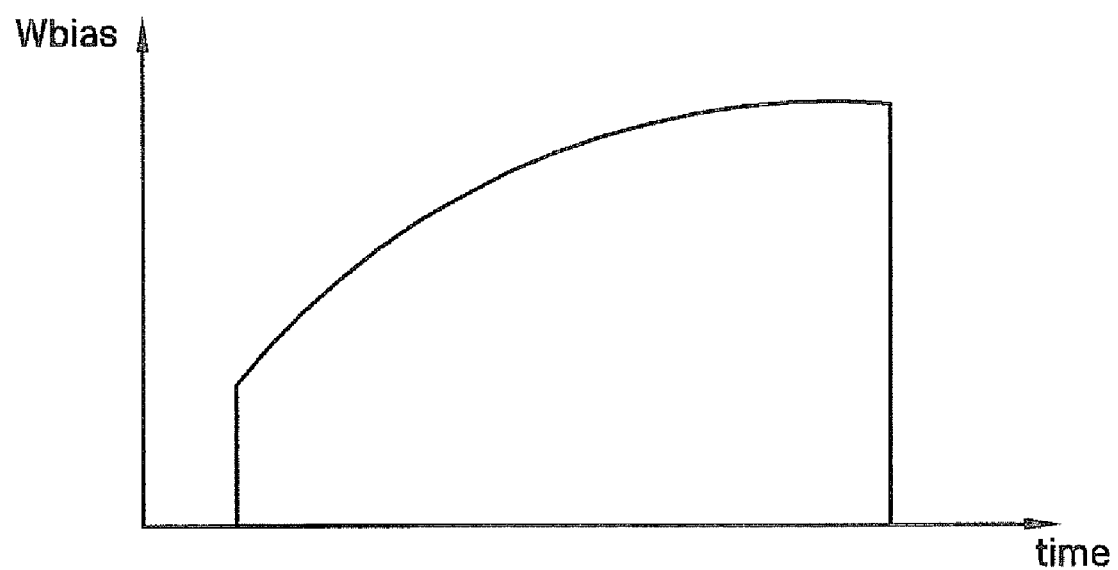
Figure 4C:
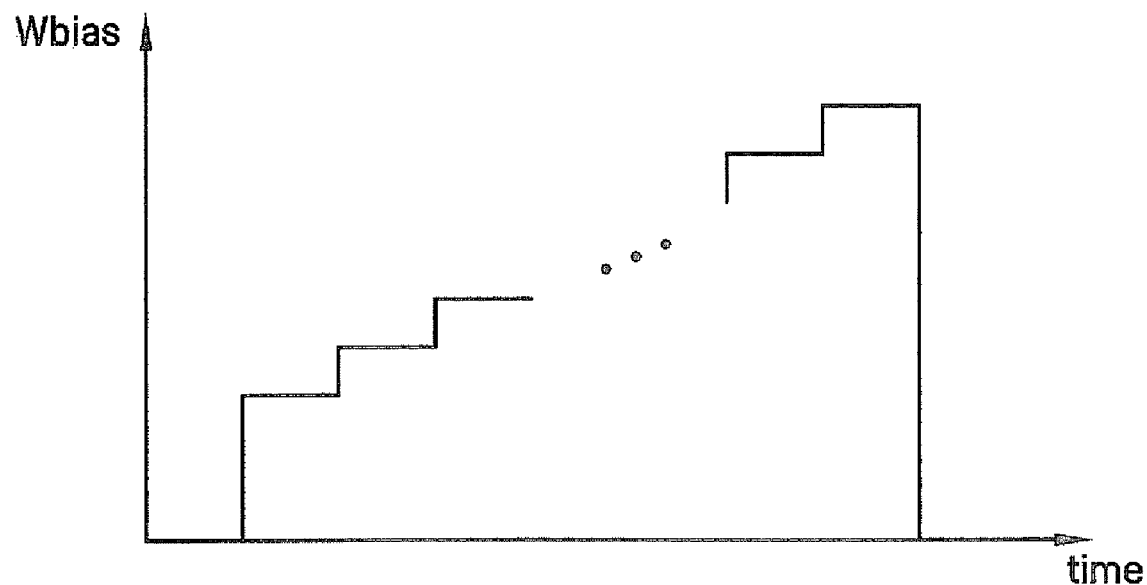
Figure 4D:
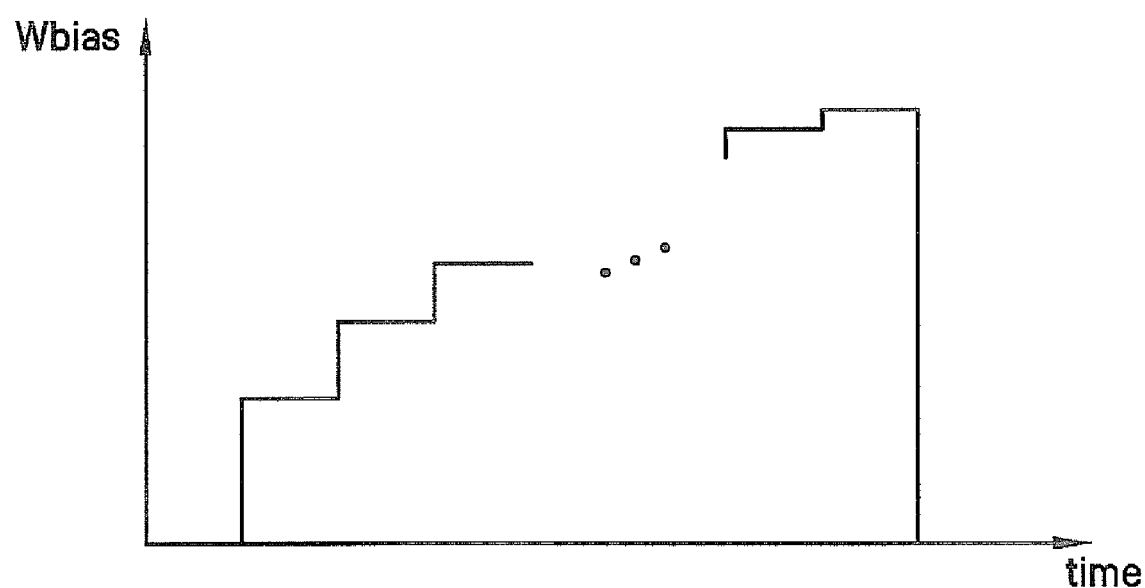

The voltage level of the write bias Wbias may gradually increase, for example, from a predetermined voltage level, as shown in FIGS. 4A to 4D. The write bias Wbias may be linearly increased as shown in FIG. 4A, it may be non-linearly increased as shown in FIG. 4B, or it may be increased stepwise as shown in FIGS. 4C and 4D. More specifically, FIGS. 4A and 4C show that increasing rate of the write bias is constant, and FIGS. 4B and 4D show that the increasing rate of the write bias lowered over time. Although not shown in FIGS. 4A to 4D, the increasing rate of the write bias may be gradually increased. Combinations and subcombinations of these and other gradual increases also may be provided in other embodiments.

Referring to FIG. 3 again, the adaptive write circuit 200 may include a sensing circuit 210 and a write bias control circuit 220, in some embodiments.

The sensing circuit 210 obtains feedback on the resistance level of the selected non-volatile memory cell 112 while supplying the write bias Wbias to the selected non-volatile memory cell 112, compares the resistance level of the selected non-volatile memory cell 112 with a reference resistance level RREF, and outputs the result of the comparison as an output signal OS.

The write bias control circuit 220 supplies the write bias Wbias to the selected non-volatile memory cell 112 and increases the voltage level of the write bias Wbias according to the output signal OS.

The write bias control circuit 220 may generate the reset bias Wbias_RESET by a voltage control method and supply the reset bias. In addition, the write bias control circuit 220 may generate the set bias Wbias_SET by a current control method and supply the set bias. The reason why the write bias control circuit 220 may generate the reset bias Wbias_RESET by a voltage control method is that, as described above, when reset data is written, it may be desirable that the reset bias Wbias_RESET have a bias level between the reset threshold voltage Vth.RESET and the set threshold voltage Vth.SET. In addition, the reason why the write bias control circuit 220 generates the set bias Wbias_SET by a current control method is that when set data is written, it may be desirable that the set bias Wbias_SET have a bias level capable of reducing or preventing the filament from being fixed (that is, a bias level capable of reducing or preventing a large amount of cell current from flowing due to the filament having an excessively large thickness). However, the generation of the reset bias Wbias_RESET by the voltage control method and the generation of the set bias Wbias_SET by the current control method are just illustrative examples, and the invention is not limited thereto.

Figure 5A:
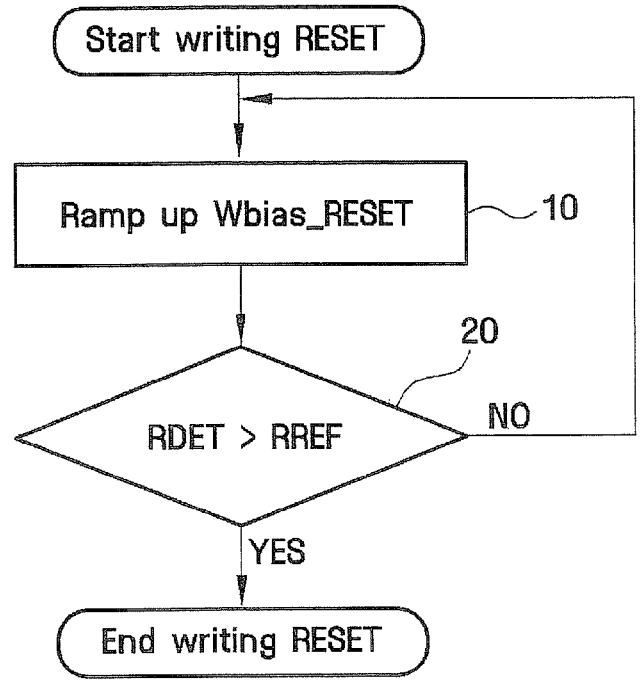
FIGS. 5A and 5B are a flowchart and a timing chart, respectively, illustrating writing of reset data in a the non-volatile memory device according to various embodiments of the invention.
Figure 5B:
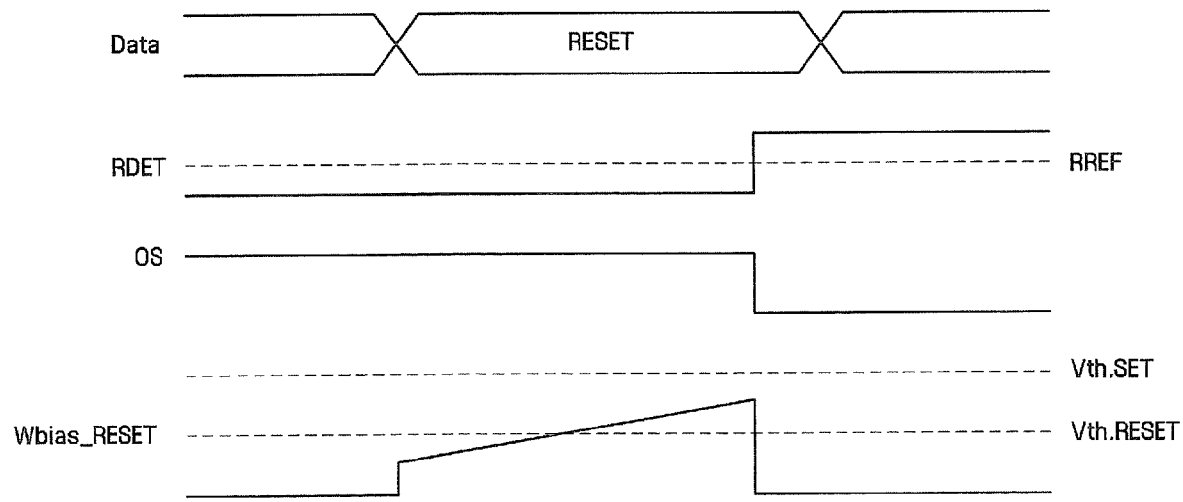
Figure 6A:
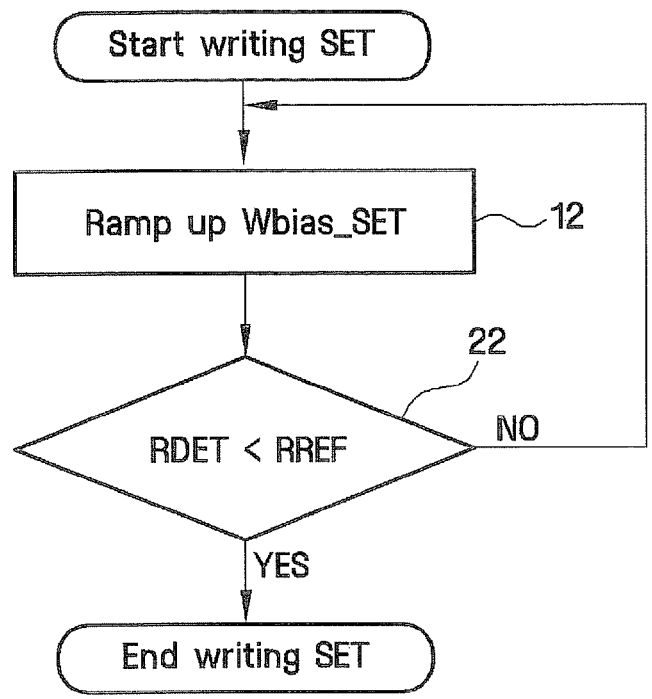
FIGS. 6A and 6B are a flowchart and a timing chart, respectively, illustrating writing of set data in a non-volatile memory device, according to various embodiments of the invention.
Figure 6B:
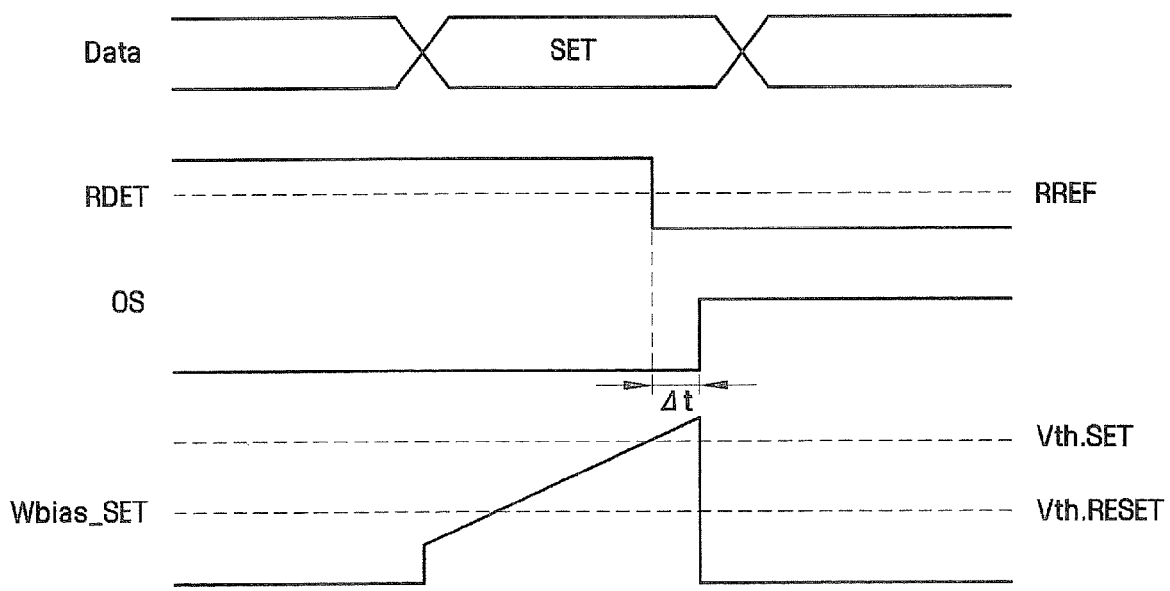
Figure 7:
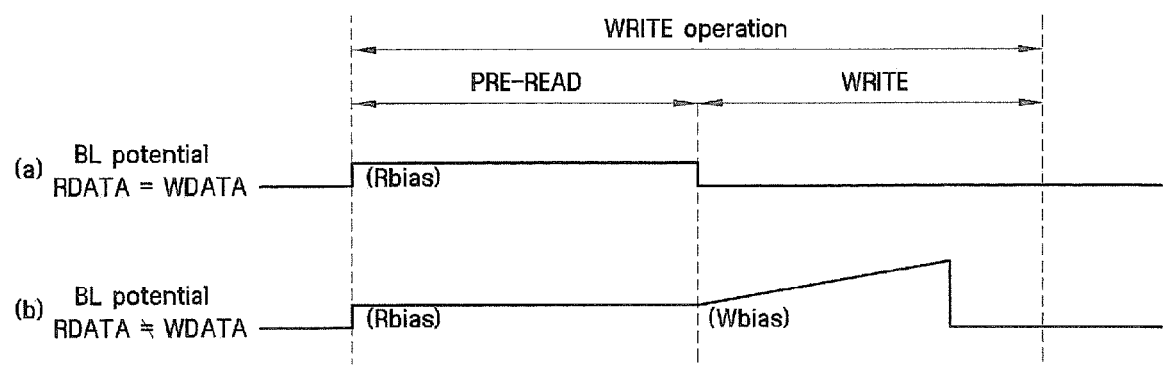
FIG. 7 is a timing chart illustrating a pre-read operation before a write operation according to various embodiments of the invention.

Next, methods of driving non-volatile memory devices according to various embodiments of the invention will be described in detail with reference to FIGS. 3, 5A, 5B, 6A, 6B, and 7. FIGS. 5A and 5B are a flowchart and a timing chart, respectively, illustrating writing reset data in a non-volatile memory device, and FIGS. 6A and 6B are a flowchart and a timing chart, respectively, illustrating writing set data in a non-volatile memory device according to various embodiments of the invention. FIG. 7 is a timing chart illustrating a pre-read before writing according to various embodiments of the invention.

First, referring to FIGS. 3 and 5A, the reset bias Wbias_RESET is supplied to the selected non-volatile memory cell 112 while being gradually increased, for example from a predetermined bias level (Block 10).

At the same time, the resistance level RDET of the selected non-volatile memory cell 112 is monitored, for example in real time, and the resistance level RDET of the selected non-volatile memory cell 112 is compared with the reference resistance level RREF (Block 20). When the resistance level RDET of the selected non-volatile memory cell 112 is lower than the reference resistance level RREF, the bias level of the reset bias Wbias_RESET is increased. On the other hand, when the resistance level RDET of the selected non-volatile memory cell 112 is higher than the reference resistance level RREF, the bias level of the reset bias Wbias_RESET is not further increased, and a write operation ends. When checking these operations through the timing charts shown in FIGS. 3 and 5B, the output signal OS is at a high level in the period where the resistance level RDEF of the selected non-volatile memory cell 112 is lower than the reference resistance level RREF, and in the period, the bias level of the reset bias Wbias_RESET is gradually increased. In the period, when the resistance level RDET of the selected non-volatile memory cell 112 is higher than the reference resistance level RREF, the output signal OS turns to a low level, so that the reset bias Wbias_RESET is not supplied any longer. In addition, the bias level of the reset bias Wbias_RESET at the time when the write operation ends is between the reset threshold voltage Vth.RESET and the set threshold voltage Vth.SET.

Referring to FIGS. 3 and 6A, the set bias Wbias_SET is supplied to the selected non-volatile memory cell 112 while being gradually increased from a predetermined bias level (Block 12).

At the same time, the resistance level RDET of the selected non-volatile memory cell 112 is monitored in real time, and the resistance level RDET of the selected non-volatile memory cell 112 is compared with the reference resistance level RREF (Block 22). When the resistance level RDET of the selected non-volatile memory cell 112 is higher than the reference resistance level RREF, the bias level of the set bias Wbias_SET is increased. On the other hand, when the resistance level RDET of the selected non-volatile memory cell 112 is lower than the reference resistance level RREF, the bias level of the set bias Wbias_SET is not further increased, and a write operation ends. When checking these operations through the timing charts shown in FIGS. 3 and 6B, the output signal OS is at a low level in the period where the resistance level RDEF of the selected non-volatile memory cell 112 is higher than the reference resistance level RREF, and in the period, the bias level of the set bias Wbias_RESET is gradually increased. In the period, when the resistance level RDET of the selected non-volatile memory cell 112 is lower than the reference resistance level RREF, the output signal OS turns to a high level, so that the reset bias Wbias_RESET is not supplied any more. In addition, the bias level of the set bias Wbias_SET at the time when the write operation ends is slightly higher than the set threshold voltage Vth.SET.

As can be seen from FIGS. 6A and 6B, the rate or level increasing speed of the reset bias Wbias_RESET may differ from that of the set bias Wbias_SET. For example, the rate or level increasing speed of the reset bias Wbias_RESET may be lower than that of the set bias Wbias_SET. This is because the writing of the reset data may be performed for a long time of about several microseconds, but the writing of the set data may be performed for a short time of about nanoseconds, as described above.

Meanwhile, it takes a predetermined amount of time (illustrated as $\Delta t$ in FIG. 6B) for the sensing circuit 210 to sense a variation in the resistance level RDET of the selected non-volatile memory cell 112 and to supply the output signal OS. However, since the level of the set bias Wbias_SET generally increases at high speed, the set bias Wbias_SET may increase for a predetermined amount of time $\Delta t$ after the resistance level RDET of the selected non-volatile memory cell 112 varies, and a large amount of cell current may flow through the variable resistive material 2 due to the bias level increased by the time $\Delta t$. Therefore, it may be desirable to adjust the level increasing speed of the set bias Wbias_SET considering these factors.

Accordingly, FIGS. 5A, 5B, 6A and 6B also illustrate embodiments of the present invention wherein a write bias supply circuit and method is configured to supply a write bias to a selected non-volatile memory cell and to increase a bias level of the write bias according to a result that is output from a sensing circuit. These figures also illustrate embodiments of the present invention wherein an adaptive write circuit is configured to supply a gradually increasing write bias to a selected non-volatile memory cell while monitoring the resistance level of the selected non-volatile memory cell, and to terminate the gradual increase of the write bias when the resistance level of the selected non-volatile memory cell varies by a given amount. Methods of driving a non-volatile memory device by supplying a write bias that gradually increases to a selected memory cell while monitoring the resistance of the selected non-volatile memory cell until the resistance level of the selected non-volatile cell varies by a given amount, to thereby write data in the selected non-volatile memory cell are also illustrated. The given amount may be any non-zero amount, and may remain constant or change as a function of time, number of times a cell has been written/read and/or other factors. The given amount may include a given (constant/variable) rate of increase/decrease, rather than a given magnitude of increase/decrease.

Referring to FIG. 7, before data is written, a read bias Rbias can be supplied to the selected non-volatile memory cell 112 through the bit line BL connected to the selected non-volatile memory cell 112 to read data stored in the selected non-volatile memory cell 112. Whether to perform a write operation may be determined according to the read result. Referring to (a) of FIG. 7, when read data RDATA is identical to write data WDATA (RDATA=WDATA), a write operation is not performed in some embodiments. Referring to (b) of FIG. 7, when the read data RDATA is not identical to the write data WDATA (RDATA≠WDATA), a write bias is supplied to the non-volatile memory cell 112 to perform a data write operation in some embodiments.

Meanwhile, the read bias Rbias generally has a lower level than that of the write bias Wbias. In particular, the read bias Rbias generally is lower than the reset threshold voltage Vth.RESET, which causes a read operation to be performed without changing the resistance level of the variable resistive material 2.

Figure 8:
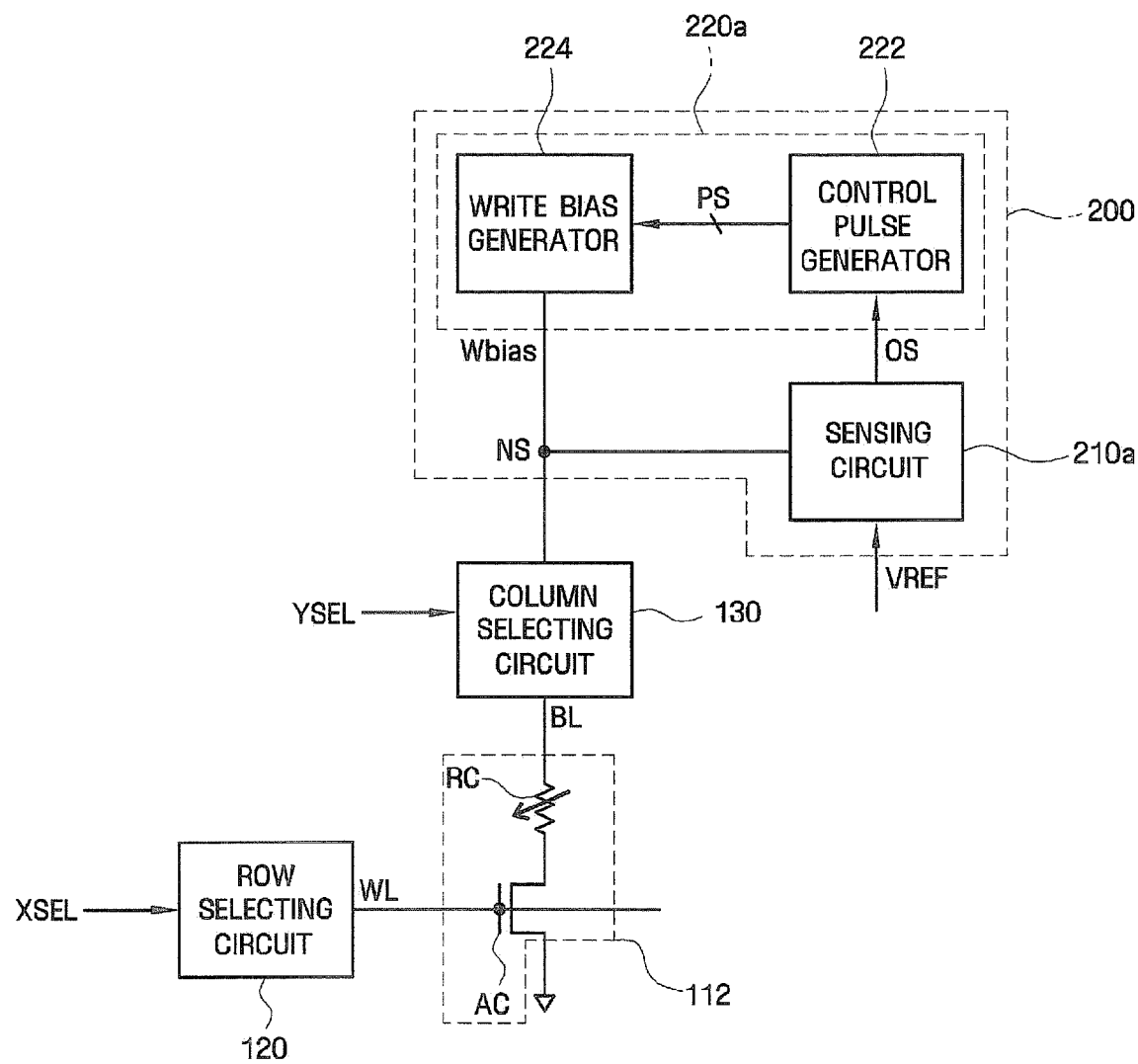
FIG. 8 is a block diagram illustrating a non-volatile memory device according to various other embodiments of the invention.

FIG. 8 is a block diagram illustrating a non-volatile memory device according to various other embodiments of the invention. In FIG. 8, an adaptive write circuit shown in FIG. 3 is shown in more detail.

Referring to FIG. 8, the adaptive write circuit 200 of the non-volatile memory device according to various embodiments of the invention supplies the write bias Wbias to the selected non-volatile memory cell 112, detects a variation in the level of a voltage at a sensing node NS that is generated by a cell current Icell flowing through the selected non-volatile memory cell 112, and adjusts the voltage level of the write bias Wbias according to the result of the detection.

The adaptive write circuit 200 of the non-volatile memory device includes the node NS, a sensing circuit 210a, and a write bias control circuit 220a.

The sensing circuit 210a compares the voltage level of the sensing node NS with a reference voltage level VREF and outputs a result of the comparison. For example, when the voltage level of the sensing node NS is lower than the reference voltage level, a high-level output signal OS may be supplied. On the other hand, when the voltage level of the sensing node NS is higher than the reference voltage level, a low-level output signal OS may be supplied.

The write bias control circuit 220a supplies the write bias Wbias and adjusts the voltage level of the write bias Wbias according to the output result from the sensing circuit 210. More specifically, the write bias control circuit 220a may include a control pulse generator 222 and a write bias generator 224. The control pulse generator 222 uses an output signal OS (for example, a high-level output signal OS) indicating that the voltage level of the sensing node NS is lower than the reference voltage VREF to generate a plurality of control pulses PS. The write bias generator 224 uses the plurality of control pulses PS to supply the write bias Wbias having a voltage level being increased from a predetermined voltage level.

The circuit structure and operation of the write bias generator 224 will be described later with reference to FIGS. 6 to 9B.

Figure 9A:
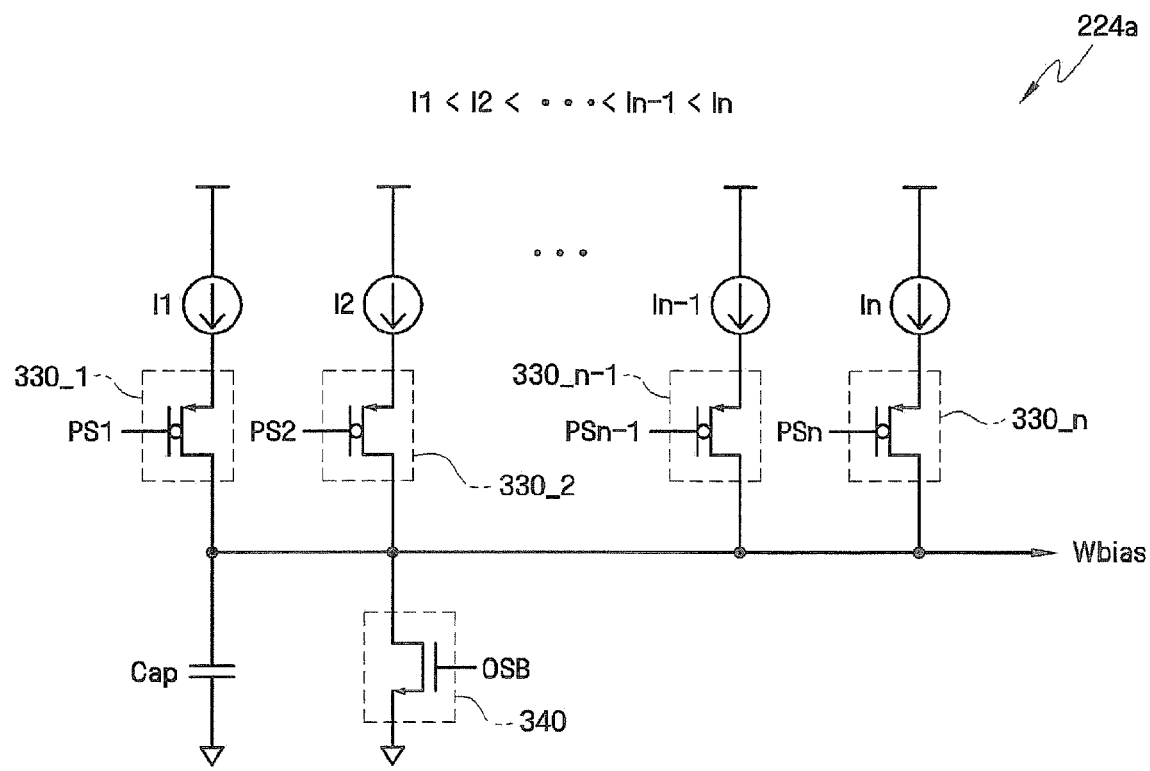
FIG. 9A is a circuit diagram illustrating an example of a write bias generator shown in FIG. 8 according to various embodiments of the invention.
Figure 9B:
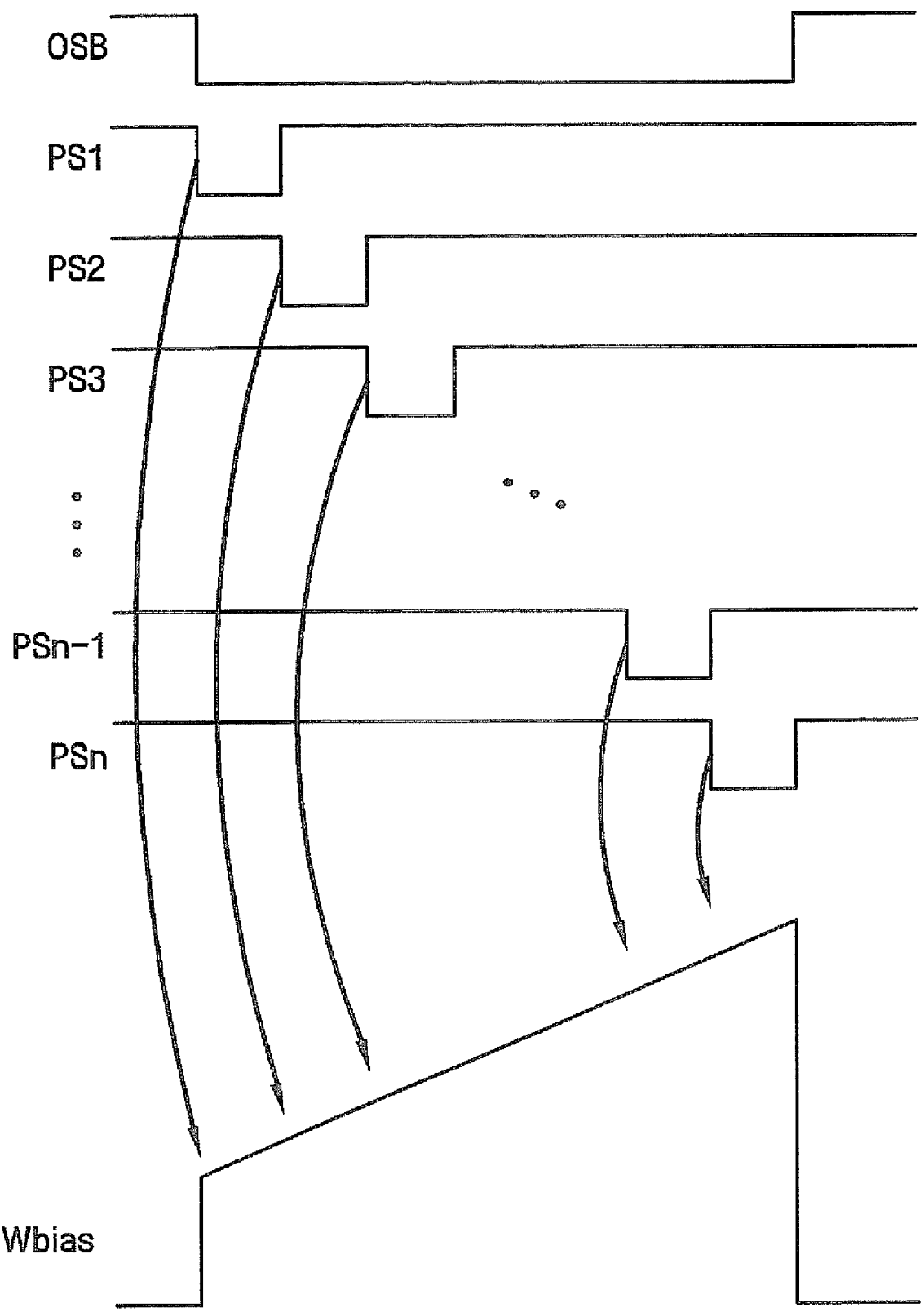
FIG. 9B is a timing chart illustrating operation of a write bias generator shown in FIG. 9A according to various embodiments of the invention.

FIG. 9A is a circuit diagram illustrating an example of the write bias generator shown in FIG. 8, and FIG. 9B is a timing chart illustrating operation of a write bias generator shown in FIG. 9A. The circuit diagram shown in FIG. 9A shows an example of a circuit for generating the write bias shown in FIG. 4A.

Referring to FIG. 9A, the write bias generator 224a includes a plurality of current sources I1 to In (for example, I1<I2< . . . <In–1<In) outputting different currents and a plurality of switches 330_1 to 330_n that are respectively connected to the current sources I1 to In and are turned on in response to control pulses PS1 to PSn to output currents from the current sources I1 to In, respectively. In FIG. 9A, PMOS transistors are used as the switches 330_1 to 330_n, but the invention is not limited thereto. In addition, the write bias generator 224 includes a transistor 340 that is turned on in response to an inverted signal OSB of the output signal from the sensing circuit 210a and a capacitor Cap that temporarily stores the current supplied from the plurality of current sources I1 to In.

Operation of a write bias generator 224a will be described with reference to FIGS. 9A and 9B. A plurality of control pulses PS1 to PSn generated on the basis of the inverted signal OSB of the output signal from the sensing circuit 210a are sequentially supplied to the write bias generator 224a. Then, in the write bias generator 224a, the current sources I1 to In corresponding to the control pulses PS1 to PSn output currents to generate the write bias Wbias. When the inverted signal OSB of the output signal turns to a high level, the write bias generator does not further increase the voltage level of the write bias.

Figure 10A:
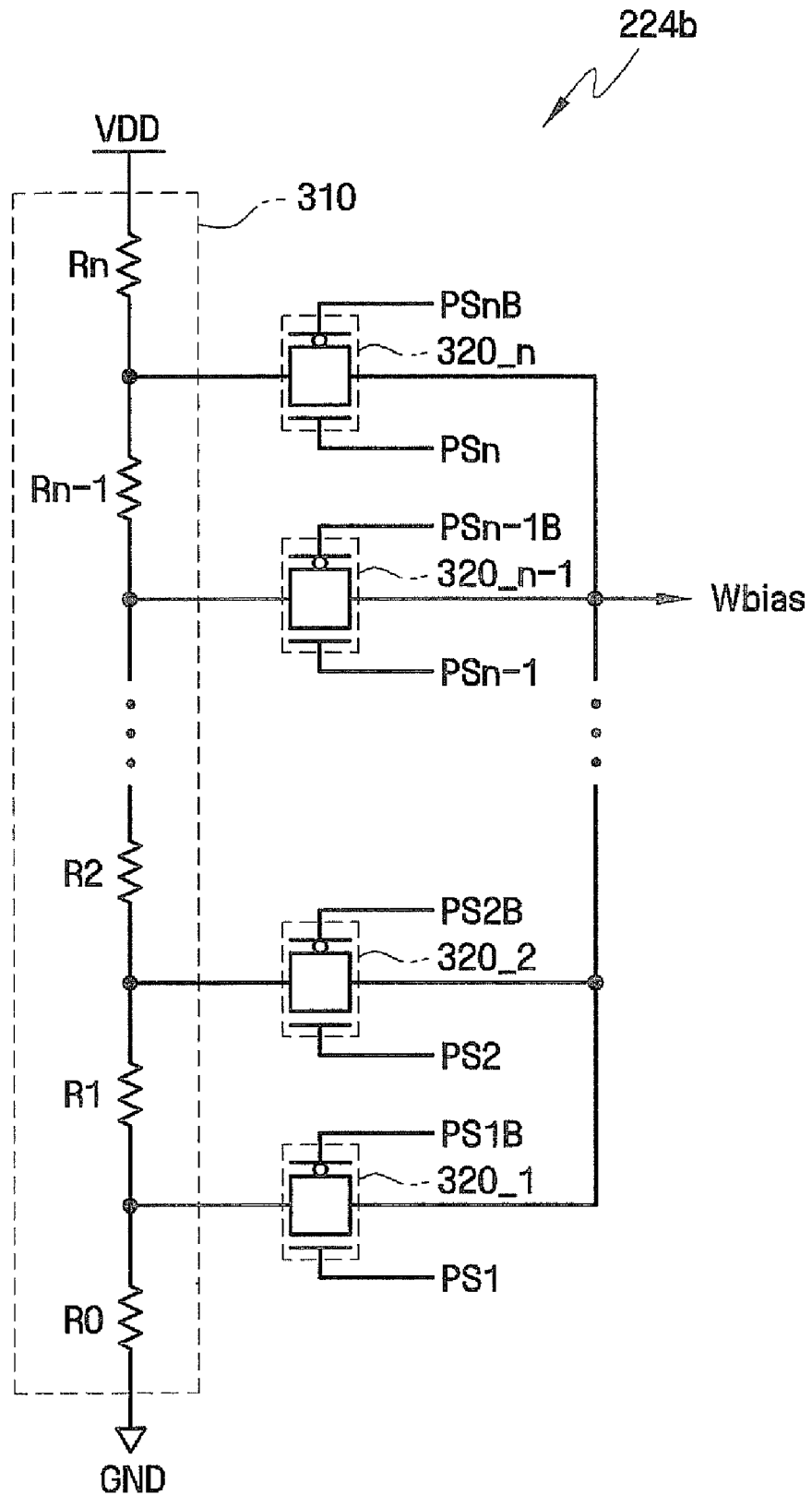
FIG. 10A is a circuit diagram illustrating another example of a write bias generator shown in FIG. 8 according to various embodiments of the invention.
Figure 10B:
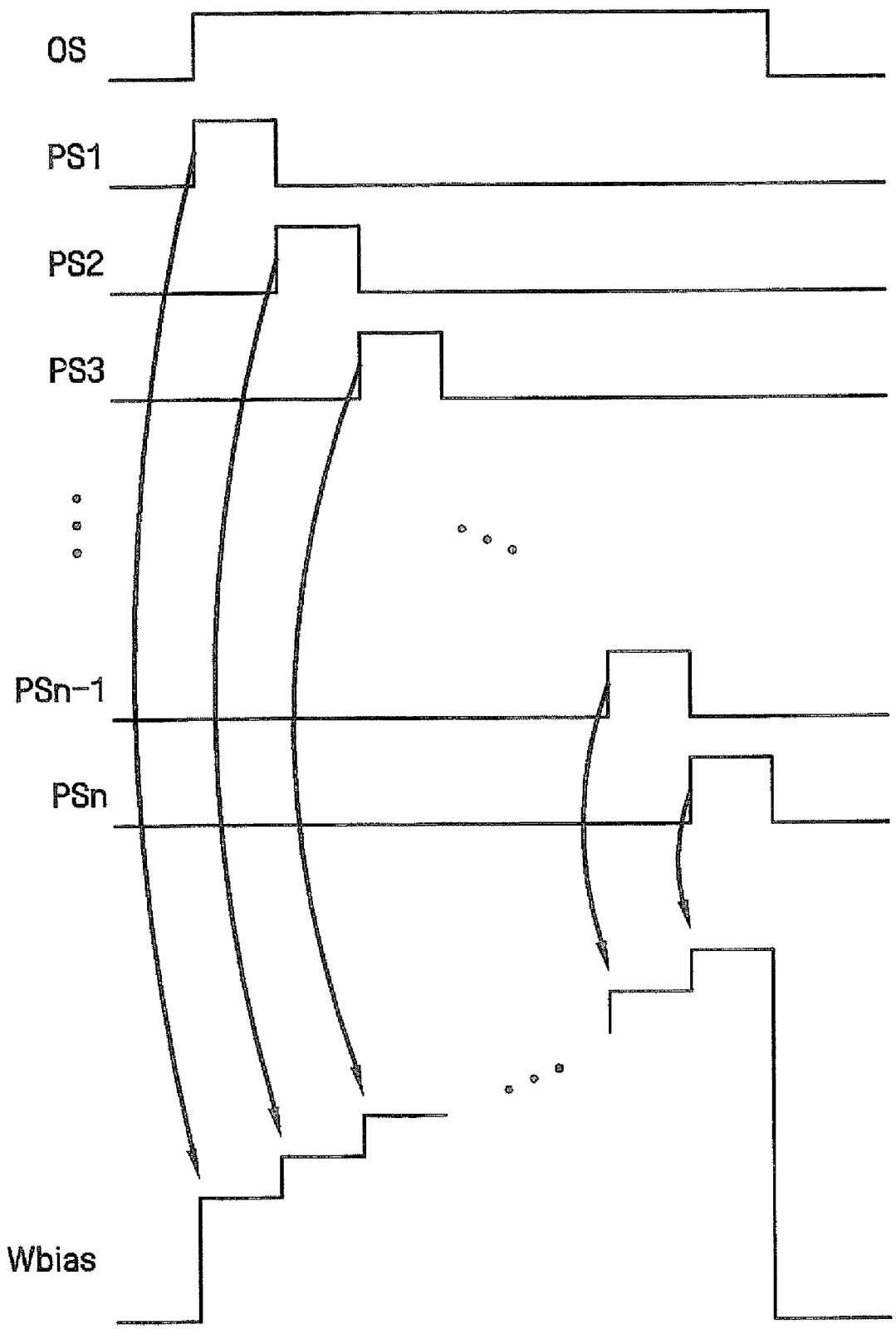
FIG. 10B is a timing chart illustrating operation of a write bias generator shown in FIG. 10A according to various embodiments of the invention.

FIG. 10A is a circuit diagram illustrating another example of the write bias generator shown in FIG. 8, and FIG. 10B is a timing chart illustrating the operation of a write bias generator shown in FIG. 10A. The circuit diagram of FIG. 10A shows another example of a circuit for generating the write bias shown in FIG. 4.

Referring to FIG. 10A, a write bias generator 224b includes a resistor column 310 including a plurality of resistors R0 to Rn and a plurality of switches 320_1 to 320_n that are connected to a plurality of nodes of the resistor column 310 and are turned on in response to control pulses PS1 to PSn and PS1B to PSnB to output voltages of the nodes, respectively. In FIG. 10A, transmission gates are used as the switches 320_1 to 320_n, but the invention is not limited thereto. The pulses PS1B to PSnB are inverted signals of the control pulses PS1 to PSn.

Operation of a write bias generator 224b will be described in detail with reference to FIGS. 10A and 10B. When the voltage level of the sensing node NS is lower than the reference voltage level VREF and thus a high-level output signal OS is generated, the control pulse generator 222 uses the high-level output signal OS to sequentially supply the control pulses PS1 to PSn to the write bias generator 224b. The write bias generator 224b outputs the voltages of the nodes corresponding to the control pulses PS1 to PSn to generate the write bias Wbias. When the voltage level of the sensing node NS is higher than the reference voltage level VREF, a low-level output signal OS is generated. Therefore, the control pulses PS1 to PSn are not generated, so that the voltage level of the write bias Wbias is not further increased.

Figure 11:
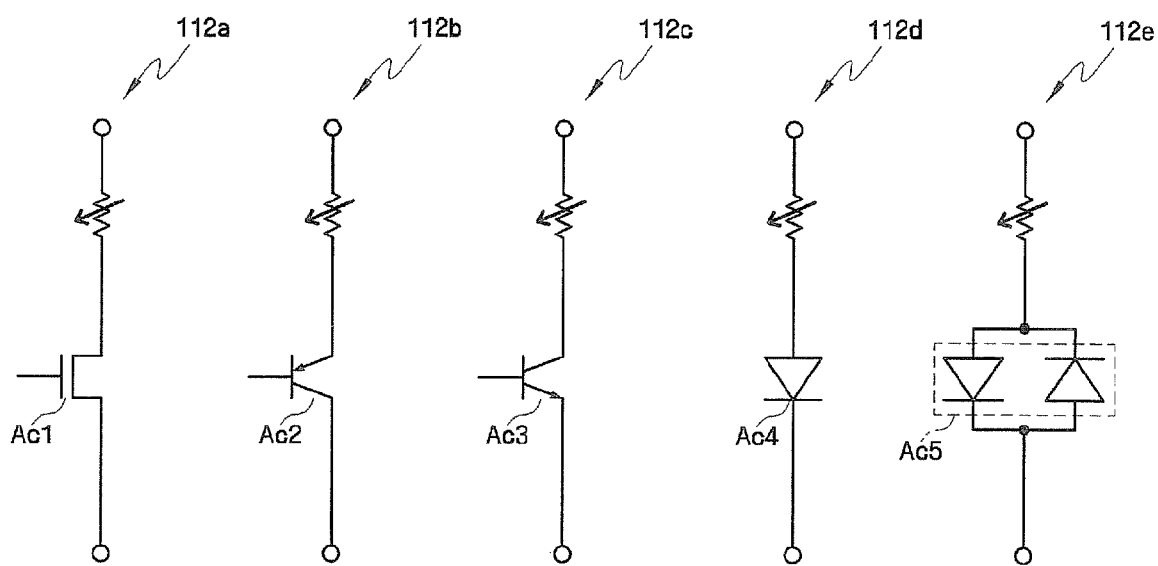
FIG. 11 is a diagram illustrating various examples of non-volatile memory cells that can be used for a non-volatile memory device according to various embodiments of the invention.

FIG. 11 is a circuit diagram illustrating various examples of non-volatile memory cells that can be used for non-volatile memory devices according to various embodiments of the invention.

Referring to FIG. 11, various types of elements may be used as access elements of the non-volatile memory cells 112. That is, an FET is used as an access element Ac1 of a non-volatile memory cell 112a, and a PNP bipolar transistor is used as an access element Ac2 of a non-volatile memory cell 112b. In addition, an NPN bipolar transistor is used as an access element Ac3 of a non-volatile memory cell 112c, and a diode is used as an access element Ac4 of a non-volatile memory cell 112d. Further, two diodes arranged in opposite directions are used as an access element Ac5 of a non-volatile memory cell 112e. However, the non-volatile memory device according to the invention is not limited thereto.

While the embodiments of the invention have been described above with reference to the accompanying drawings, it will be understood by those skilled in the art that various modifications and changes of the invention can be made without departing from the scope and spirit of the invention. Therefore, it should be understood that the above-described embodiment is not restrictive, but illustrative in all aspects.

As described above, a non-volatile memory device according to various embodiments of the invention can make a reset bias having a bias level between a set threshold voltage and a reset threshold voltage of each of the plurality of non-volatile memory cells in a memory cell array and a set bias having a bias level allowing a filament of each of the plurality of non-volatile memory cells in the memory cell array not to be fixed. Therefore, according to various embodiments of the invention, it is possible to accurately write data on the non-volatile memory cell and thus improve the reliability of a write operation.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A non-volatile memory device comprising:
a memory cell array comprising a plurality of word lines, a plurality of bit lines, and a plurality of non-volatile memory cells, a respective non-volatile memory cell having a variable resistive material and an access element connected between the corresponding word line and the corresponding bit line, the variable resistive material having a resistance level that varies according to data to be stored;
a selection circuit configured to select at least one non-volatile memory cell of the plurality of non-volatile memory cells in which data will be written;
a sensing circuit configured to obtain feedback on the resistance level of the selected non-volatile memory cell while supplying the write bias to the selected non-volatile memory cell, and further configured to compare the resistance level of the selected non-volatile memory cell and a reference resistance level, and to output a result of the comparison; and
an adaptive write circuit configured to supply a write bias to the selected non-volatile memory cell through the bit line connected to the selected non-volatile memory cell to write data on the selected non-volatile memory cell and further configured to gradually increase the write bias during writing until the resistance level of the selected non-volatile memory cell varies below or above a predetermined resistance level,
wherein the sensing circuit is operative to feedback the resistance level to the adaptive write circuit seamlessly during writing, and
wherein the adaptive write circuit modifies the write bias according to the feedback resistance level during writing.

2. The non-volatile memory device of claim 1, wherein the adaptive write circuit comprises:
a write bias supply circuit configured to supply the write bias to the selected non-volatile memory cell and to vary the voltage level of the write bias according to the result output from the sensing circuit.

3. The non-volatile memory device of claim 1, wherein the adaptive write circuit comprises:
a sensing node having a voltage level that varies according to a cell current flowing through the selected non-volatile memory cell,
wherein the sensing circuit is further configured to compare the voltage level of the sensing node with a reference voltage level and to output a result of the comparison; and
a write bias supply circuit configured to supply the write bias to the selected non-volatile memory cell through the sensing node and to vary the bias level of the write bias according to the result output from the sensing circuit.

4. The non-volatile memory device of claim 1, wherein the adaptive write circuit is configured to vary the write bias stepwise.

5. The non-volatile memory device of claim 1, wherein the adaptive write circuit is configured to vary the write bias linearly and/or non-linearly.

6. The non-volatile memory device of claim 1, wherein the adaptive write circuit is configured to vary the write bias at a rate of the write bias that decreases over time.

7. The non-volatile memory device of claim 1, wherein:
the write bias comprises a reset bias for writing reset data and a set bias for writing set data, and
the adaptive write circuit is configured to increase a speed of the reset bias different from that of the set bias.

8. The non-volatile memory device of claim 1, wherein the adaptive write circuit is configured to supply a reset bias for writing reset data by voltage control.

9. The non-volatile memory device of claim 1, wherein the adaptive write circuit is configured to supply a set bias for writing set data by current control.

10. The non-volatile memory device of claim 1, wherein:
the adaptive write circuit is configured to supply a read bias to the selected non-volatile memory cell through the bit line connected to the selected non-volatile memory cell to read out data stored in the selected non-volatile memory cell before performing a write operation, and
when the read data is not identical with data to be written, the adaptive write circuit is configured to perform the write operation, and when the read data is identical with data to be written, the adaptive write circuit is configured to not perform the write operation.

11. The non-volatile memory device of claim 10, wherein the level of the read bias is lower than that of the write bias.

12. The non-volatile memory device of claim 1, wherein the non-volatile memory cell is an RRAM, PRAM and/or MRAM memory cell.

13. The non-volatile memory device of claim 1, wherein the adaptive write circuit supplies the write bias generated using a plurality of control pulses and increases the write bias in every control pulse.

14. A non-volatile memory device comprising:
a memory cell array comprising a plurality of non-volatile memory cells having a variable resistive material whose resistance level varies according to data to be stored;
a selection circuit configured to select at least one non-volatile memory cell of the plurality of non-volatile memory cells in which data will be written;
a sensing circuit configured to obtain feedback on the resistance level of the selected non-volatile memory cell while supplying the write bias to the selected non-volatile memory cell, and further configured to compare the resistance level of the selected non-volatile memory cell and a reference resistance level, and to output a result of the comparison; and
an adaptive write circuit configured to supply a gradually increasing write bias during writing a data representing one logic level selected from among a plurality of logic levels to the selected non-volatile memory cell while monitoring the resistance level of the selected non-volatile memory cell and to terminate the variation of the write bias when the resistance level of the selected non-volatile memory cell varies by a given amount,
wherein the sensing circuit is operative to feedback the resistance level to the adaptive write circuit seamlessly during writing, and
wherein the adaptive write circuit modifies the write bias according to the feedback resistance level during writing.

15. The non-volatile memory device of claim 14, wherein the adaptive write circuit is configured to vary the write bias stepwise.

16. The non-volatile memory device of claim 14, wherein the adaptive write circuit is configured to vary the write bias linearly and/or non-linearly.

17. The non-volatile memory device of claim 14, wherein the adaptive write circuit is configured to supply a reset bias for writing reset data by voltage control.

18. The non-volatile memory device of claim 14, wherein the adaptive write circuit is configured to supply a set bias for writing set data by current control.

19. The non-volatile memory device of claim 14, wherein the adaptive write circuit supplies the write bias generated using a plurality of control pulses and increases the write bias in every control pulse.

20. The non-volatile memory device of claim 19, wherein the adaptive write circuit determines whether the resistance level of the selected non-volatile memory is lower than a predetermined reference resistance level as soon as the write bias in one control pulse is supplied.

21. The non-volatile memory device of claim 19, wherein the adaptive write circuit increases the write bias until the resistance level of the selected non-volatile memory cell is lower than a predetermined reference resistance level.

22. A method of driving a non-volatile memory device that includes a plurality of non-volatile memory cells having a variable resistive material whose resistance level varies according to data to be stored, the driving method comprising:
supplying a write bias that gradually increases to a selected non-volatile memory cell during writing a data representing one logic level selected from among a plurality of logic levels while monitoring the resistance level of the selected non-volatile memory cell, until the resistance level of the selected non-volatile memory cell varies by a given amount, to thereby write the data representing one logic level in the selected non-volatile memory cell,
wherein the write bias is modified according to the feedback resistance level during writing.

23. The method of claim 22, further comprising:
before supplying the write bias, supplying a read bias to the selected non-volatile memory cell to read out data stored in the selected non-volatile memory cell; and when the read data is not identical with data to be written, supplying the write bias and, when the read data is identical with data to be written, not supplying the write bias.

24. The non-volatile memory device of claim 13, wherein the adaptive write circuit determines whether the resistance level of the selected non-volatile memory is lower than a predetermined reference resistance level as soon as the write bias in one control pulse is supplied.

25. The non-volatile memory device of claim 13, wherein the adaptive write circuit increases the write bias until the resistance level of the selected non-volatile memory cell is lower than a predetermined reference resistance level.

26. The non-volatile memory device of claim 22, wherein the write bias is generated using a plurality of control pulses and increases in every control pulse.

27. The non-volatile memory device of claim 26, wherein supplying the write bias comprises determining whether the resistance level of the selected non-volatile memory is lower than a predetermined reference resistance level as soon as the write bias in one control pulse is supplied.

28. The non-volatile memory device of claim 26, wherein the write bias increases until the resistance level of the selected non-volatile memory cell is lower than a predetermined reference resistance level.

* * * * *